US006154046A

United States Patent [19]

Kermani

[11] Patent Number: 6,154,046

[45] Date of Patent: *Nov. 28, 2000

[54] PRECONDITIONING INPUT SIGNALS OF LOGIC GATES FOR GLITCH-FREE OUTPUT SIGNAL

[75] Inventor: Bahram Ghaffarzadeh Kermani, Whitehall, Pa.

[73] Assignee: Lucent Technologies Inc., Murray Hill, N.J.

[ * ] Notice: This patent is subject to a terminal disclaimer.

[21] Appl. No.: 09/225,641

[22] Filed: Jan. 5, 1999

[51] Int. Cl.[7] .................................... H03K 19/0948

[52] U.S. Cl. .................................... 326/21; 326/93

[58] Field of Search .......................... 326/21–27, 93, 326/83, 86

[56] References Cited

U.S. PATENT DOCUMENTS

| | | | |
|---|---|---|---|
| 5,552,719 | 9/1996 | Murakami | 326/27 |
| 5,565,796 | 10/1996 | Nakase | 326/83 |
| 5,929,676 | 7/1999 | Graf, III | 327/144 |
| 5,983,014 | 11/1999 | Shay | 327/270 |

*Primary Examiner*—Michael Tokar
*Assistant Examiner*—Don Phu Le
*Attorney, Agent, or Firm*—Duane, Morris & Heckscher LLP

[57] ABSTRACT

An input signal preconditioning circuit receives at least first and second digital input signals. The input signals are modified to provide first and second preconditioned input signals which cannot simultaneously transition in opposite directions.

21 Claims, 2 Drawing Sheets

200

A  D  Q  212  AA  220  221  $A_0$  213  CLK  CLK  211  240  241  B  D  Q  232  BB  233  CLK  CLK  231  210

300

CLK  A  $A_0$  AA  $T_0$  $T_1$  $T_2$  $T_3$

100

200

300

PRECONDITIONING INPUT SIGNALS OF LOGIC GATES FOR GLITCH-FREE OUTPUT SIGNAL

BACKGROUND OF THE INVENTION

1. Field of the Invention

The present invention relates to logic gates having input and output signals and, in particular, to logic gates with glitch-free output signals.

2. Description of the Related Art

Logic gates are used in a wide variety of systems. Typical logic gates include AND, OR, NAND, and NOR logic gates. In a mixed system having both synchronous and asynchronous components, gates are considered to be asynchronous elements. Unfortunately, logic gates having two or more inputs, such as AND and OR gates, are prone to glitches.

Referring now to FIGS. 1A–C, there is shown an input signal timing diagram 100, and OR and AND logic gates 120, 140 and accompanying output signal timing diagrams 130, 150, respectively, illustrating the OR gate and AND gate glitch problems encountered by prior art logic gates. As shown in input signal timing diagram 100, a synchronous clock signal CLK is used in the system employing OR and AND gates 120, 140. Input signals A and B appear in the system, and ideally transition only at the moment of the positive (upward) edge transition of the clock signal CLK. However, in practical implementations, there is typically a slight skew between the two input signals undergoing simultaneous transitions. When the two input signals are simultaneously transitioning in different directions, this can lead to glitches in the output. In the present application, two signals are considered to transition simultaneously, even if there is some skew therebetween, as long as each signal transitions due to the same clock signal transition.

As illustrated in FIG. 1B, OR gate 120 has input signals $A_1$, $B_1$, and output signal $C_1$. At a positive edge of the clock signal CLK $A_1$ transitions up and $B_1$ transitions down. However, there is a slight $A_1/B_1$ skew therebetween, causing a momentary glitch 135 to be produced in output $C_1$.

Similarly, as illustrated in FIG. 1C, AND gate 140 has input signals $A_2$, $B_2$, and output signal $C_2$. At a positive edge of the clock signal CLK $A_2$, transitions up and $B_2$ transitions down. However, there is a slight $A_2/B_2$ skew therebetween, causing a momentary glitch 155 to be produced in output $C_2$. If the outputs of the logic gates 120, 140 are not latched, output glitches 135, 155 can propagate throughout the system and cause potential failures.

SUMMARY

In the present invention, an input signal preconditioning circuit receives at least first and second digital input signals. The first and second input signals are modified to provide first and second preconditioned input signals which cannot simultaneously transition in opposite directions.

DESCRIPTION OF THE PREFERRED EMBODIMENT

In the present invention, the input signals applied to logic gates are preconditioned to guarantee glitch-free gate output signals, under all conditions. In particular, input signals for logic gates are preconditioned in the present invention to prevent simultaneous input signal transitions in opposite directions.

Figure 1A:
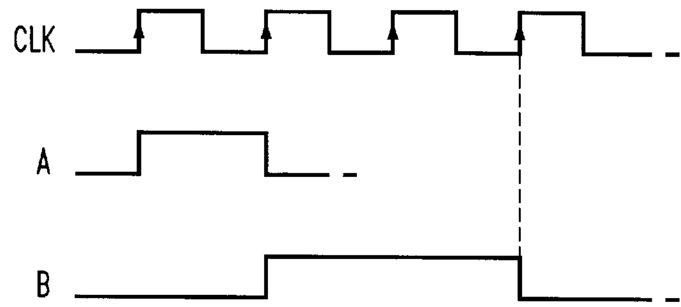
FIGS. 1A–C show an input signal timing diagram, and OR and AND logic gates and accompanying output signal timing diagrams, respectively, illustrating the OR gate and AND gate glitch problems encountered by prior art logic gates.
Figure 1B:
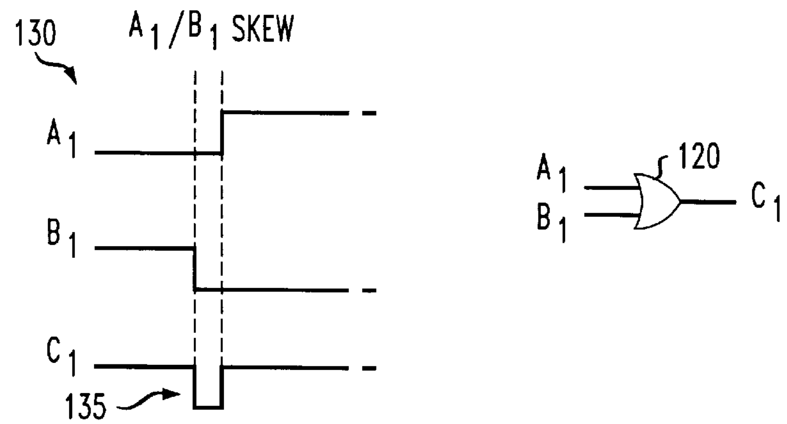
Figure 1C:
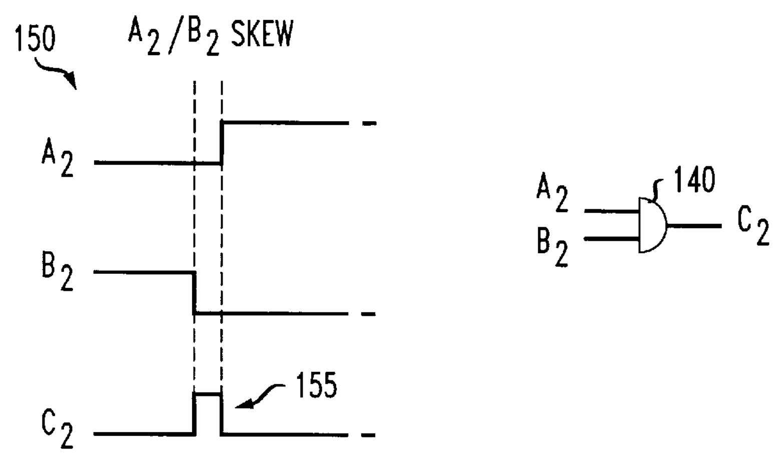
Figure 2:
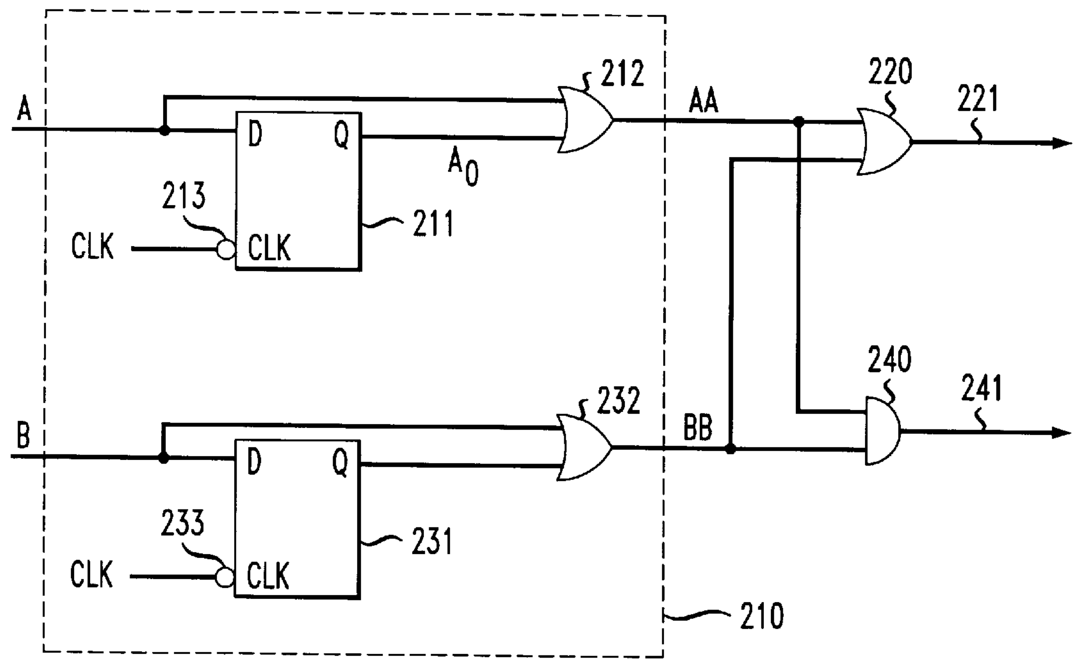
FIG. 2 is a circuit diagram of a logic circuit having exemplary OR and AND logic gates and an input signal preconditioning circuit, in accordance with an embodiment of the present invention.
Figure 3:
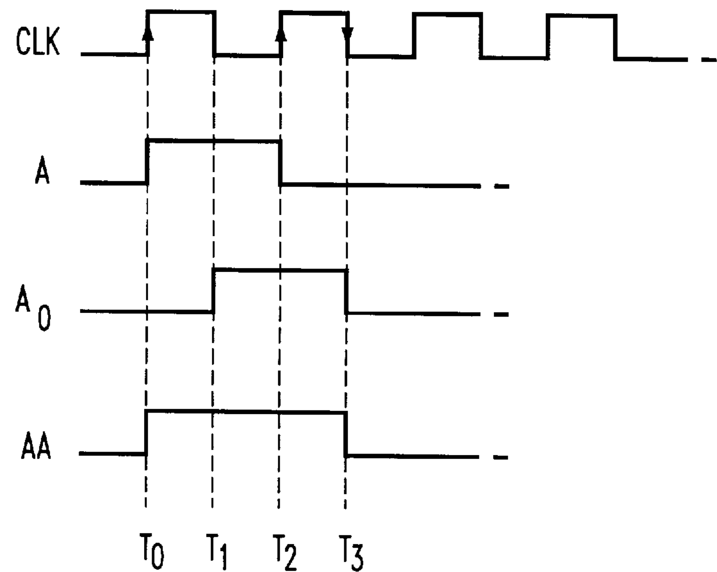
FIG. 3 is a signal timing diagram illustrating the operation of the logic circuit of FIG. 2.

Referring now to FIG. 2, there is shown a circuit diagram of a logic circuit 200 having exemplary OR and AND logic gates 220, 240 and an input signal preconditioning circuit or unit 210, in accordance with an embodiment of the present invention. FIG. 3 is a signal timing diagram 300 illustrating the operation of logic circuit 200. Signal timing diagram 300 shows the clock signal CLK, input signal A, delayed input signal $A_0$, and modified or preconditioned input signal AA. For purposes of the present discussion, it is assumed that all transitions in circuit 200 are synchronized with the positive clock edge of the CLK signal.

Referring once more to FIG. 2, signal preconditioning circuit 210 comprises two D-type flip-flops 211, 231, each having a D input, a Q output, and a clock input CLK having an inverter 213, 233 attached to the CLK input terminal. Signal preconditioning circuit 210 further comprises two OR gates 212, 232, intercoupled with flip flops 211, 231 as illustrated. As used herein, the term flip-flop refers to any clocked delay element suitable for delaying an input signal as described herein.

Signal preconditioning circuit 210 receives the two input signals A and B that normally would be received directly by logic gates 220, 240, and outputs pre-conditioned input signals AA and BB. Thus, OR gate 220 and AND gate 230 each receives input signals AA and BB from the output of signal preconditioning circuit 210 instead of receiving input signals A and B directly. Signal preconditioning circuit 210 modifies input signals A and B to provide modified or preconditioned input signals AA and BB which are such that a glitch at the output lines 221, 241 of logic gates 220, 240, is impossible.

As will be appreciated, signal preconditioning circuit 210 prevents the above-described glitch problem by providing modified or preconditioned input signals that never simultaneously transition in opposite directions. This is accomplished, in one embodiment, by signal preconditioning circuit 210 ensuring that the preconditioned input signals produced thereby have a low-to-high transition synchronized, as usual, with the rising or positive edge of the CLK signal, but where the preconditioned input signals with a high-to-low transition are synchronized with the falling or negative edge of the CLK signal. Thus, the rising edge of preconditioned input signal AA changes with the rising edge of the CLK signal, simultaneously with the rising edge of input signal A. However, the falling edge of preconditioned input signal AA changes with the falling edge of the CLK signal, one half CLK cycle after the falling edge of input signal A. As used herein, one complete CLK cycle corresponds to the time from $T_0$ to $T_2$, and one half CLK cycle corresponds to the time interval from $T_2$ to $T_3$.

As shown in signal timing diagram 300, input signal A may transition "up" or in the positive direction at time $T_0$, which coincides with a positive edge transition of the CLK signal. When input signal A transitions in the negative direction, this occurs at time $T_2$, which again coincides with a positive edge transition of the CLK signal. However, delay flip-flop 211 is triggered by the falling edge of the CLK signal, due to the presence of inverter 213. Thus, delayed input signal $A_0$ is delayed by a half-cycle but mirrors input signal A. Thus, input signal A transitions from high-to-low at time $T_2$ but delayed input signal $A_0$ does not transition from high-to-low until time $T_3$. Because delayed input signal $A_0$ is OR'd with input signal A by OR gate 212, the output of OR gate 212, modified signal AA, does not transition from high-to-low until time $T_3$.

The present invention, therefore, conditions or preconditions the input signals applied to logic gates to prevent output glitches, by preventing simultaneous input signal transitions in opposite directions. This is done by ensuring that rising edges of preconditioned input signals occur only with the rising edge of a CLK signal, and that all falling edges of preconditioned input signals occur only with the falling edge of the CLK signal.

As will be appreciated, this prevents the output signal glitch problem described above, without the necessity of latching the outputs of logic gates. In addition, the present invention does not cause delays, since at most one type of input signal transition (e.g., falling) is delayed by at most one-half clock cycle, to the falling edge of the CLK signal, and the negative CLK edge is ignored in positive CLK edge systems. The present invention also simplifies circuit design by removing the concern for inserting the correct amount of delay on the legs of logic gates, since glitch-free operation is ensured at the functional design level by the signal preconditioning circuit of the present invention.

Those skilled in the art will appreciate that, in alternative embodiments, alternative configurations of signal preconditioning unit may be employed to accomplish the above-described functions. In an alternative embodiment, for example, the rising edges of preconditioned input signals change with the falling edge of the CLK signal, and vice-versa for the falling edges of the preconditioned input signal. In another alternative embodiment, logic gates having more than two inputs, such as three inputs, are used which are also prone to glitches. In this embodiment, a signal preconditioning circuit is used to precondition all three input signals instead of only two.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An input signal preconditioning circuit synchronized by a clock signal having successive clock signal transitions comprising successive rising and falling edges, comprising:

(a) means for receiving at least first and second digital input signals, each of which transitions only at one of a rising and a falling edge of the clock signal; and (b) means for modifying the first and second input signals to provide first and second preconditioned input signals which cannot transition in opposite directions at the same clock signal transition.

2. The circuit of claim 1, wherein:

the first input signal circuit comprises (1) a first flip-flop having an input coupled to the input terminal of the first input signal circuit, a clock input coupled through an inverter to the system clock signal, and an output; and (2) a first OR gate having a first input coupled to the input terminal of the first input signal circuit, a second input coupled to the output of the first flip-flop, and an output for providing the first preconditioned input signal; and the second input signal circuit comprises (1) a second flip-flop having an input coupled to the input terminal of the second input signal circuit, a clock input coupled through an inverter to the system clock signal, and an output; and (2) a second OR gate having a first input coupled to the input terminal of the second input signal circuit, a second input coupled to the output of the second flip-flop, and an output for providing the second preconditioned input signal.

3. The circuit of claim 1, wherein the first and second input signals transition only at the rising edge of the clock signal.

4. The circuit of claim 1, wherein:

means (b) comprises means for delaying all transitions of the first and second preconditioned input signals which are in one of a rising and a falling direction until the other of the rising and falling edge of the clock signal.

5. The circuit of claim 4, wherein:

the first and second input signals transition only at the rising edge of the clock signal;

all transitions of the first and second preconditioned input signals which are in said one of the rising and falling direction are delayed until the falling edge of the clock signal; and all transitions of the first and second preconditioned input signals which are in said other of the rising and falling direction are permitted to occur at the rising edge of the clock signal.

6. The circuit of claim 5, wherein said one direction is the falling direction and the other direction is the rising direction.

7. The circuit of claim 1, wherein:

means (b) comprises means for delaying all transitions of the first and second preconditioned input signals which are in one of a rising and a falling direction so that all transitions of the first preconditioned input signal in a given direction are separated from all transitions of the second preconditioned input signal in an opposite direction by at least one half of the clock cycle.

8. The circuit of claim 1, wherein:

the first and second input signals transition only at a rising edge of the clock signal;

means (a) comprises at least first and second input lines;

means (b) comprises at least first and second input signal circuits, each input signal circuit comprising:

(1) a flip-flop having an input coupled to the respective first or second input line, a clock input coupled through an inverter to the system clock signal, and an output; and (2) an OR gate having a first input coupled to the respective first or second input line, a second input coupled to the output of the flip-flop, and an output for providing the respective first or second preconditioned input signal.

9. An input signal preconditioning circuit synchronized by a clock signal having successive clock signal transitions comprising successive rising and falling edges, comprising:

(a) a first input signal circuit coupled to a first input signal at an input terminal and for providing a preconditioned first input signal at an output terminal, wherein the preconditioned first input signal transitions from high-to-low only at one of a rising and a falling edge of the clock signal and the preconditioned first input signal transitions from low-to-high only at the other of the rising and the falling edge of the clock signal; and (b) a second input signal circuit coupled to a second input signal at an input terminal and for providing a preconditioned second input signal at an output terminal, wherein the preconditioned second input signal transitions from high-to-low only at one of a rising and a falling edge of the clock signal and the preconditioned second input signal transitions from low-to-high only at the other of the rising and the falling edge of the clock signal.

10. A circuit comprising at least one logic gate having at least two input terminals and an output terminal for providing an output signal, a method for preventing glitches in the output signal, the method comprising the steps of:

(a) receiving at least first and second input signals which transition only at one of a rising and a falling edge of a clock signal;

(b) modifying the first and second input signals to provide at least first and second preconditioned input signals which cannot simultaneously transition in opposite directions, comprising the step of delaying all transitions of the first and second preconditioned input signals which are in one of a rising and a falling direction so that all transitions of the first preconditioned input signal in a given direction are separated from all transitions of the second preconditioned input signal in an opposite direction by at least one half of the clock cycle; and (c) applying said at least first and second preconditioned input signals to the respective input terminals of the at least one logic gate.

11. In a circuit comprising at least one logic gate having at least two input terminals and an output terminal for providing an output signal, a method for preventing glitches in the output signal, the method comprising the steps of:

(a) receiving at least first and second input signals and a clock signal for synchronizing the circuit, the clock signal having successive clock signal transitions comprising successive rising and falling edges wherein each of the first and second input signals transitions only at one of a rising and a falling edge of the clock signal;

(b) modifying the first and second input signals to provide at least first and second preconditioned input signals which cannot transition in opposite directions at the same clock signal transition; and (c) applying said at least first and second preconditioned input signals to the respective input terminals of the at least one logic gate.

12. The method of claim 11, wherein:

step (b) comprises the step of delaying all transitions of the first and second preconditioned input signals which are in one of a rising and a falling direction so that all transitions of the first preconditioned input signal in a given direction are separated from all transitions of the second preconditioned input signal in an opposite direction by at least one half of the clock cycle.

13. The method of claim 11, wherein the first and second input signals transition only the rising edge of the clock signal.

14. The method of claim 11, wherein:

step (b) comprises the step of delaying all transitions of the first and second preconditioned input signals which are in one of a rising and a falling direction until the other of the rising and falling edge of the clock signal.

15. The method of claim 14, wherein:

the first and second input signals transition only at the rising edge of the clock signal;

all transitions of the first and second preconditioned input signals which are in said one of the rising and falling direction are delayed until the falling edge of the clock signal; and all transitions of the first and second preconditioned input signals which are in said other of the rising and falling direction are permitted to occur at the rising edge of the clock signal.

16. The method of claim 15, wherein said one direction is the falling direction and the other direction is the rising direction.

17. In a circuit comprising at least one logic gate having at least two input terminals and an output terminal for providing an output signal, a method for preventing glitches in the output signal, the method comprising the steps of:

(a) receiving at least first and second input signals which transition only at one of a rising and a falling edge of a clock signal;

(b) modifying the first and second input signals to provide at least first and second preconditioned input signals which cannot simultaneously transition in opposite directions, comprising the step of delaying all transitions of the first and second preconditioned input signals which are in one of a rising and a falling direction until the other of the rising and falling edge of the clock signal; and (c) applying said at least first and second preconditioned input signals to the respective input terminals of the at least one logic gate.

18. An input signal preconditioning circuit, comprising:

(a) means for receiving at least first and second digital input signals, wherein the first and second input signals transition only at one of a rising and a falling edge of a clock signal; and (b) means for modifying the first and second input signals to provide first and second preconditioned input signals which cannot transition in opposite directions at the same clock signal transition, said means comprising means for delaying all transitions of the first and second preconditioned input signals which are in one of a rising and a falling direction until the other of the rising and falling edge of the clock signal.

19. An input signal preconditioning circuit, comprising:

(a) means for receiving at least first and second digital input signals, wherein the first and second input signals transition only at one of a rising and a falling edge of a clock signal having a clock cycle; and (b) means for modifying the first and second input signals to provide first and second preconditioned input signals which cannot simultaneously transition in opposite directions, said means comprising means for delaying all transitions of the first and second preconditioned input signals which are in one of a rising and a falling direction so that all transitions of the first preconditioned input signal in a given direction are separated from all transitions of the second preconditioned input signal in an opposite direction by at least one half of the clock cycle.

20. An input signal preconditioning circuit, comprising:

(a) at least first and second input lines for receiving at least first and second digital input signals which transition only at a rising edge of a system clock signal;

(b) at least first and second input signal circuits for modifying the first and second input signals, respectively, to provide first and second preconditioned input signals, respectively, which cannot simultaneously transition in opposite directions, said each input signal circuit comprising:

(1) a flip-flop having an input coupled to the respective first or second input line, a clock input coupled through an inverter to the system clock signal, and an output; and (2) an OR gate having a first input coupled to the respective first or second input line, a second input coupled to the output of the flip-flop, and an output for providing the respective first or second preconditioned input signal.

21. An input signal preconditioning circuit, comprising:

(a) a first input signal circuit coupled to a first input signal at an input terminal and for providing a preconditioned first input signal at an output terminal, wherein the preconditioned first input signal transitions from high-to-low only at one of a rising and a falling edge of a clock signal and the preconditioned first input signal transitions from low-to-high only at the other of the rising and the falling edge of the clock signal, wherein the first input signal transitions only at one of a rising and a falling edge of the clock signal, the first input signal circuit comprising (1) a first flip-flop having an input coupled to the input terminal of the first input signal circuit, a clock input coupled through an inverter to the system clock signal, and an output; and (2) a first OR gate having a first input coupled to the input terminal of the first input signal circuit, a second input coupled to the output of the first flip-flop, and an output for providing the first preconditioned input signal; and (b) a second input signal circuit coupled to a second input signal at an input terminal and for providing a preconditioned second input signal at an output terminal, wherein the preconditioned second input signal transitions from high-to-low only at one of a rising and a falling edge of a clock signal and the preconditioned second input signal transitions from low-to-high only at the other of the rising and the falling edge of the clock signal, wherein the second input signal transitions only at one of the rising and a falling edge of the clock signal, the second input signal circuit comprising (1) a second flip-flop having an input coupled to the input terminal of the second input signal circuit, a clock input coupled through an inverter to the system clock signal, and an output; and (2) a second OR gate having a first input coupled to the input terminal of the second input signal circuit, a second input coupled to the output of the second flip-flop, and an output for providing the second preconditioned input signal.

* * * * *